United States Patent [19]

Chapman

[11] Patent Number: 4,656,431
[45] Date of Patent: Apr. 7, 1987

[54] DIGITAL FREQUENCY DISCRIMINATOR

[75] Inventor: Ronald H. Chapman, Wheaton, Ill.

[73] Assignee: Motorola, Inc., Schaumburg, Ill.

[21] Appl. No.: 836,921

[22] Filed: Mar. 6, 1986

[51] Int. Cl.$^4$ .................... H03D 3/00; H03K 9/06
[52] U.S. Cl. .................................. 329/50; 328/134; 329/107; 329/126; 375/82
[58] Field of Search ............... 329/50, 104, 107, 122, 329/124, 126, 110; 375/80, 82, 94; 307/525, 526; 328/133, 134

[56] References Cited

U.S. PATENT DOCUMENTS

| | | | |
|---|---|---|---|
| 3,353,101 | 11/1967 | Kawai et al. | 329/126 |
| 3,461,389 | 9/1966 | Whalen | 328/109 |
| 3,624,523 | 11/1971 | Katz | 328/141 |
| 3,624,528 | 6/1970 | Adlhock et al. | 329/104 |
| 3,624,529 | 11/1969 | Gebelein | 329/104 |
| 3,753,141 | 9/1971 | Van Elk et al. | 331/1 A |
| 4,023,114 | 9/1975 | Meixler | 331/1 A |
| 4,246,497 | 1/1981 | Lawson et al. | 328/133 X |
| 4,325,030 | 3/1980 | Colamonico | 328/140 |
| 4,387,351 | 12/1980 | Furiga et al. | 332/19 |
| 4,594,563 | 6/1986 | Williams | 307/526 X |

Primary Examiner—Siegfried H. Grimm
Attorney, Agent, or Firm—Robert J. Crawford

[57] ABSTRACT

An incoming signal is received and processed through a discriminator function. A reference signal is generated corresponding to the incoming signal. First and second difference signals, corresponding to the frequency difference between the reference signal and the incoming signal are generated, each having a unique phase. A direction signal is generated from the first and second difference signals to indicate if the incoming signal frequency is greater than or less than the reference signal frequency. Pulses are generated which relate to the difference in frequency between the reference signal and the incoming signal, and a recovery circuit is used for recovering modulation from the generated pulses and the direction signal.

26 Claims, 3 Drawing Figures

4,656,431

DIGITAL FREQUENCY DISCRIMINATOR

FIELD OF THE INVENTION

The present invention relates to FM demodulation and, more particularly, to FM receiver frequency discrimination.

BACKGROUND

There are a number of known methods to recover carrier signal modulation. Some of the more well known methods include the Costas loop and the standard FM frequency discriminator. The Costas loop is primarily intended for the recovery of binary phase shift modulated signals on a synchronous basis. It is basically comprised of two parallel synchronous demodulators, whose local oscillator signals are in phase quadrature to each other. The outputs of the two signals are fed to a mixer, which provides an output that is a function of the phase difference between the mixer inputs. The mixer output signal is used as a control signal to adjust the local oscillator phase so as to keep the oscillator synchronous with the carrier of the received signal.

The FM frequency discriminator produces an output voltage which is directly proportional to the frequency deviation from its center frequency. A typically used configuration of an FM frequency discriminator comprises two selected resonant circuits whose output magnitudes are a function of the frequency of the signal applied. Two AM wave detectors are used to recover the magnitude of these signals. Each output has a magnitude with opposite polarity. The outputs of the AM wave detectors are added such that a linear DC signal is obtained which corresponds to a difference between the input signal frequency and the frequency to which the circuit is tuned.

Both the Costas loop and the standard FM frequency discriminator are practical for recovering their respective digital and audio modulated signals. However, the Costas loop has limited use for audio modulation, while the standard FM frequency discriminator does not have a stable or controllable center frequency. Since the standard frequency discriminator circuitry is generally not very stable and is highly sensitive to temperature variations, the tuning of the discriminator is not very reliable.

Furthermore, for receiver circuitry which is required to demodulate a signal having a very narrow bandwidth, the ability to maintain a stable center frequency is even more critical. Narrow band applications usually include an automatic frequency control (AFC) circuit, which includes compensating the center frequency of the local oscillator by a signal derived from the discriminator, as is similarly performed in the Costas loop. If the discriminator's center frequency is not stable the ability to accurately adjust the local oscillator is substantially degraded. Since narrow band applications are becoming more and more popular, the need for a low cost discriminator circuit having a stable center frequency is well recognized.

Although there have been other attempts to design accurate discriminator circuits, most are variations of the above mentioned techniques having similar type problems.

OBJECTS AND SUMMARY OF THE PRESENT INVENTION

Accordingly, it is an object of the present invention to provide a discriminator whose center frequency is stable and may accurately be controlled.

It is a further object of the present invention to provide a discriminator using digital circuitry which can accurately recover modulation on the carrier frequency.

It is a further object of the present invention to provide a digital discriminator which uses less circuitry than those known in the art.

Briefly, the present invention pertains to a digital discriminator which includes receiving an incoming signal and processing it with a reference signal having a corresponding frequency. First and second difference signals, corresponding to the frequency difference between the reference signal and the incoming signal are generated, each having a unique phase. A direction signal is generated from the first and second difference signals to indicate if the incoming signal frequency is greater than or less than the reference signal frequency. Pulses are generated which relate to the difference between the reference signal and the incoming signal, and a recovery circuit is used for recovering modulation, including a frequency difference voltage, from the generated pulses and the direction signal.

These and other objects and advantages of the present invention will be apparent to one skilled in the art from the detailed description below taken with the drawings.

DETAILED DESCRIPTION OF THE PREFERRED EMBODIMENT

Figure 1:
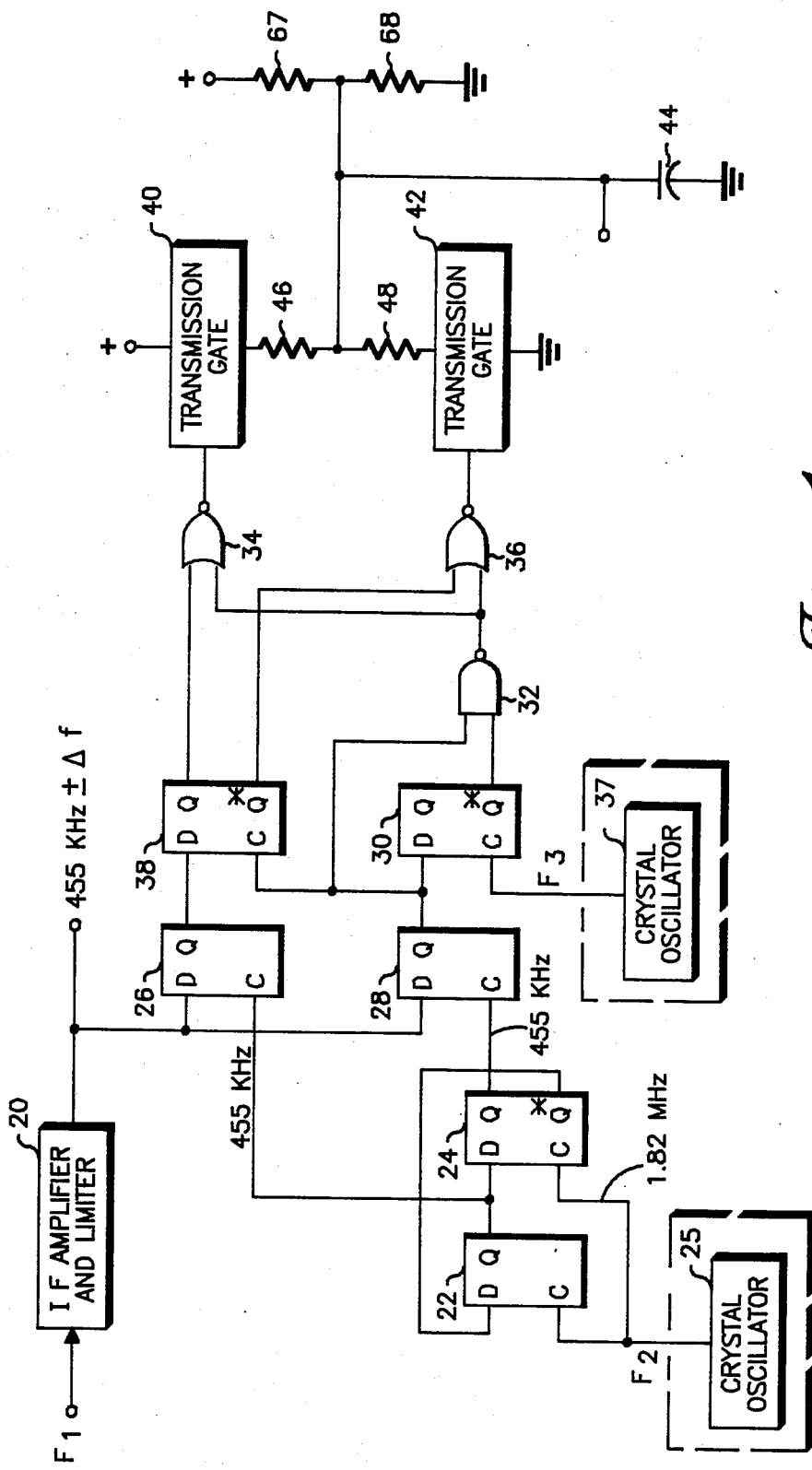
FIG. 1 is a circuit diagram depicting one arrangement of digital demodulation in accordance with the present invention.

Referring to FIG. 1, a circuit diagram of a digital discriminator is shown in accordance with the present invention. A received signal, F1, preferably the radio intermediate frequency (IF), is amplified and peak limited through an IF amplifier and limiter 20. In the embodiment shown, the IF is equal to 455 KHz.

A second signal is shown, F2, which is connected to the clock inputs of flip-flops 22 and 24. This frequency should be very stable. It may be derived from a stable crystal oscillator 25 or, if available, from a radio synthesizer (not shown). The signal F2 should preferably be four times the desired center frequency of the discriminator. In this instance, F1 is 1.82 MHz.

Flip-flops 22 and 24 comprise a divide by four circuit with respect to F2. Each respective Q output of flip-flops 22 and 24 pulses at a rate defined by F2/4. Further, the Q outputs are in quadrature, i.e. approximately 90 degrees out of phase.

The Q outputs of flip-flops 22 and 24 drive the clocks of flip-flops 26 and 28, respectively. The output of IF amplifier and limiter 20 is connected to the data input, D, of flip-flops 26 and 28. By connecting F1 and the two F2/4 signals to the flip-flops 26 and 28 in this manner, flip-flops 26 and 28 form two digital mixers which each provide a difference frequency between F1 and F2/4. The phase relationship between the ouputs of flip-flops 26 and 28 depend on whether F1 is greater than or less than F2/4. This phase relationship will be discussed further with FIG. 2.

The difference frequency output from flip-flop 28 is differentiated in combination by flip-flop 30 and NAND gate 32. Hence, the output of NAND gate 32 produces a recurring narrow pulse at the difference frequency between F1 and F2/4.

Frequency source F3 feeding the clock of flip-flop 30 is used to set the pulse width out of NAND gate 32. F3 is preferably greater than the peak deviation expected. However, the stability of F3 is not critical and may easily be generated from a crystal oscillator 37 or from available signals in the radio. The pulse width out of NAND gate 32 is set so that at each difference frequency cycle its output goes low (logic 0) for a relatively short period of time. This allows the NOR gates 34 and 36 to effectively become enabled.

Flip-flop 38 is used to determine the phase relationship between the outputs of flip-flops 26 and 28. While F1 is less than F2/4, the Q output of flip-flop 38 is low and the Q* output of flip-flop 38 is high (logic 1). As long as the Q output of flip-flop 38 is low, NOR gate 34 will pulse at a rate determined by the output of NAND gate 32.

Alternatively, as the difference between F1 and F2/4 decreases, the output of NOR gate 34 will pulse less frequently until F1 becomes greater than F2/4, at which time the output of NOR gate 34 will remain low, and the output of NOR gate 36 will begin to pulse at a rate determined by the output of NAND gate 32.

The outputs of NOR gates 34 and 36 are configured to control transmission gates 40 and 42, respectively. Transmission gates 40 and 42 are used to charge and discharge capacitor 44 through resistors 46 and 48 by producing current pulses to capacitor 44. Resistors 67 and 68 are used to establish the average voltage when transmission gates 40 and 42 are inactive. As mentioned above, while F1 is less than F2/4, the output of NOR gate 34 will pulse at a rate determined by the the difference frequency at flip-flop 28. Hence, the pulses transmitted to capacitor 44 will maintain an above average voltage as long as F1 is less than F2/4. This configuration, along with appropriately selected resistor and capacitor values, will produce a DC voltage at capacitor 44 to determine a relative difference between the reference frequency, F2, and the received incoming signal F1.

Accordingly, the embodiment shown in FIG. 1 provides the function of a standard discriminator by determining whether the received frequency is above or below the referece frequency and by how much. The circuit thus provides a recovered voltage which tracks the center frequency of the received signal.

Figure 2:
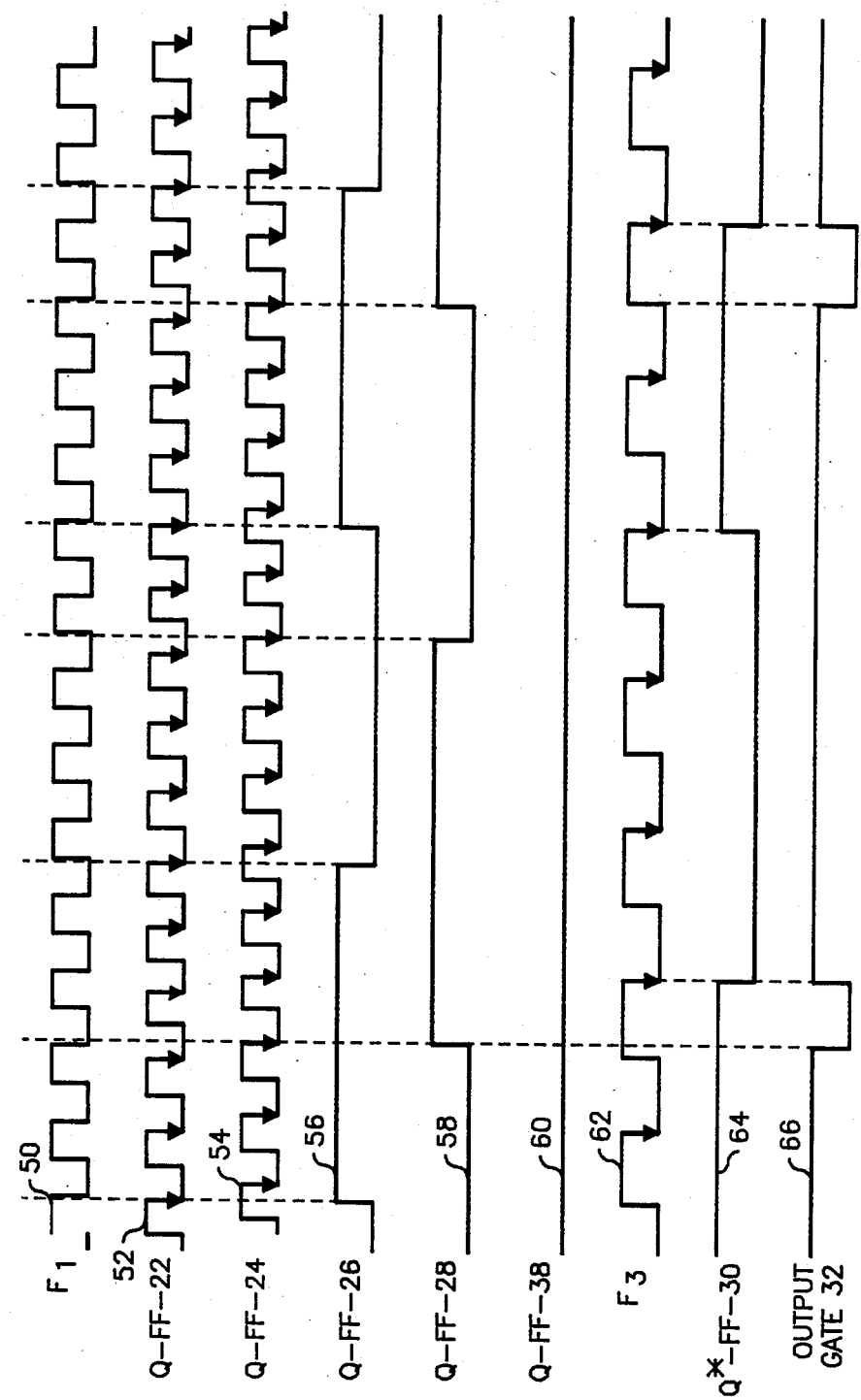
FIG. 2 is a timing diagram illustrating pertinent signal transitions at various points of the circuit in FIG. 1.

Referring now to FIG. 2, timing signals for the circuit of FIG. 1 are depicted by way of example. As illustrated, F1 is less than F2/4 and all flip-flops are negative edge triggered. The received signal, F1, is shown as waveform 50. F2/4 at the output of flip-flop 22 is shown as waveform 52 to be about 8% (greatly exaggerated for illustrative purposes) less than F1. Waveform 54 depicts the F2/4 output from flip-flop 24 lagging waveform 52 by 90 degrees. The corresponding phase shifted difference frequencies are shown as waveforms 56 and 58 for flip-flops 26 and 28, respectively. Accordingly, since F1 is less than F2/4 in this example, Q of flip-flop 38 is low, waveform 60. Waveform 62 shows F3, generated from an external source. Waveform 66 shows F3 and the difference frequency setting the pulse width output from NAND gate 32.

The output voltage at capacitor 44 is derived from pulses output from NOR gates 34 and 36. The waveform for NOR gate 34 is the same as waveform 66 since Q of flip-flop 38 is low. The waveform for the output of NOR gate 36 is not shown since it is a logic 0.

Although this example shows no modulation on F1, it should be understood by one skilled in the art that such modulation will be produced as a varying voltage on capacitor 44. In the embodiment of FIG. 1, any modulation recovered is limited to frequencies less than about 50 Hz. Nevertheless, it should be understood that modifications may be made to improve this restriction.

Figure 3:
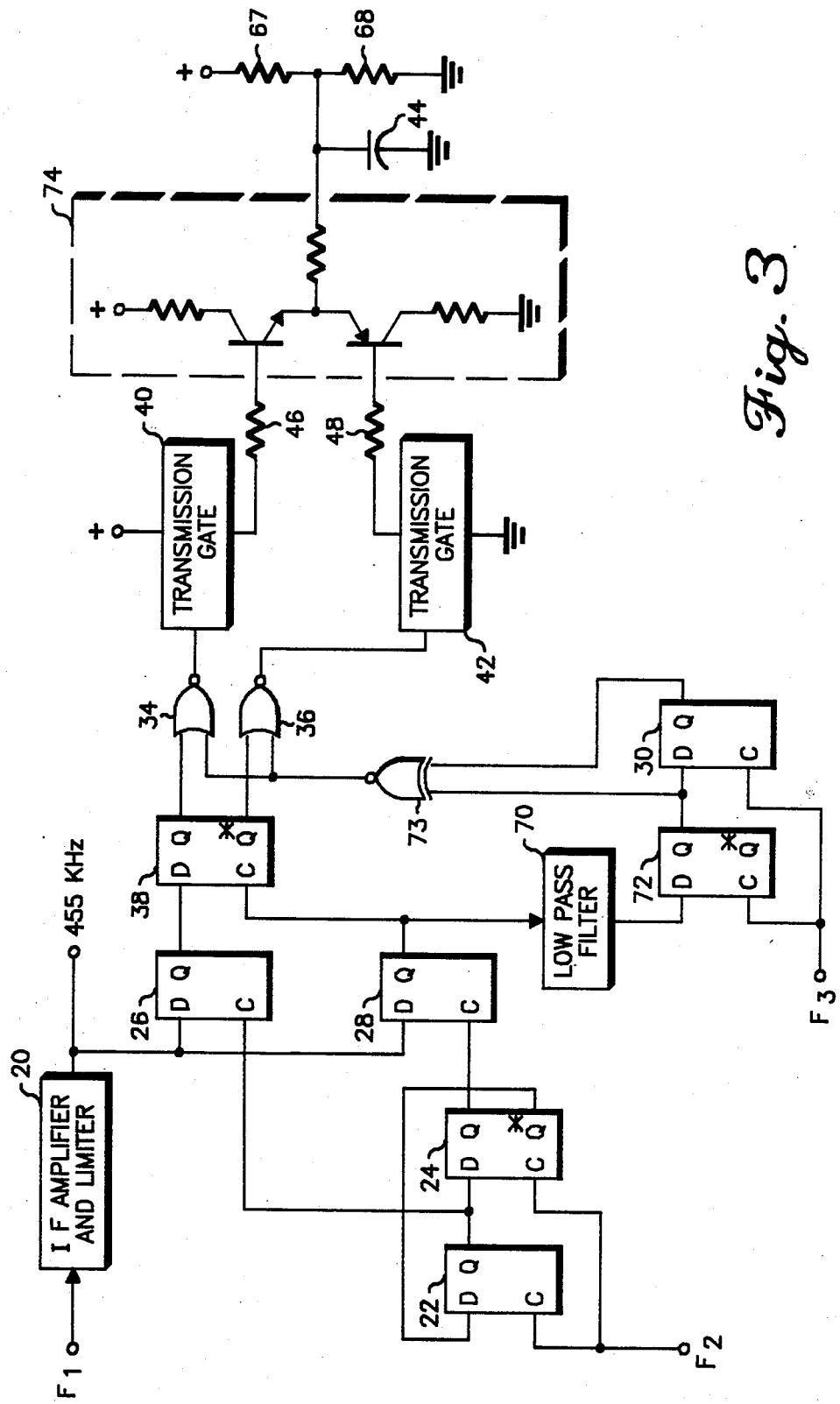
FIG. 3 is an alternative embodiment of the circuit diagram shown in FIG. 1.

Referring now to FIG. 3, an alternative embodiment for a digital discriminator is shown in accordance with the present invention. This circuit diagram is similar in the same repects as that shown in FIG. 1. However, there are some significant improvements.

A low pass filter 70 is positioned in line between the difference frequency output from flip-flop 28 and an additional flip-flop 72. The purpose of the low pass filter 70 is to control the bandwidth of frequency error signals that may generate control pulses. If the frequency difference between the desired center frequency, F2/4, and the received IF signal, F1, is too great, the difference will not pass through the low pass filter and will not generate correction pulses to the transmission gates 40 and 42.

The purpose of the additional flip-flop 72 is to improve the pulse width control of the signal provided at the output of the EXNOR gate 73, implemented in FIG. 1 as NAND gate 32. Flip-flop 72, along with flip-flop 30, removes any nonsynchronous edges from the signals applied to the EXNOR gate 73.

The implementation of the EXNOR gate 73 in place of NAND gate 32 produces a pulse at its output upon each transition of the difference signal. In the implemenatation of FIG. 1, a pulse was produced only once each difference signal cycle, i.e. half as many times as in FIG. 3. The reason for this modification is that more frequent recurring pulses to NOR gates 34 and 36 allows for a greater gain at the output of the discriminator. This additionally allows for modulation recovery over a broader frequency range. It should also be noted that Q of flip-flop 30 is being used as the output, rather than Q*.

The transistor configuration 74 shown in this embodiment illustrates yet another but acceptable way to recover the audio and difference frequency voltage.

While the invention has been particularly shown and described with reference to two preferred embodiments, it will be understood by those skilled in the art that various other modifications and changes may be made to the present invention described above without departing from the spirit and scope thereof.

I claim:
1. A digital discriminator comprising:
   means for receiving an incoming signal;
   means for generating a reference signal;
   means for generating first and second difference signals, each corresponding to a frequency difference between said reference signal and said incoming signal, but having offset phases;
   means for generating a direction signal from said first and second difference signals, said direction signal indicating if the incoming signal frequency is greater than or less than the reference signal frequency;

means for generating pulses relating to the difference in frequency between the reference signal and the incoming signal; and means for recovering modulation from said generated pulses and said direction signal.

2. The digital discriminator according to claim 1, wherein said means for receiving an incoming signal includes means for peak limiting said incoming signal.

3. The digital discriminator according to claim 1, wherein said reference signal includes a first phase signal and a second phase signal.

4. The digital discriminator according to claim 3, including said first phase signal being about 90 degrees out of phase with said second phase signal.

5. The digital discriminator according to claim 1, wherein said means for generating a first difference signal includes means for latching said incoming signal at a level change of said reference signal.

6. The digital discriminator according to claim 1, wherein said means for generating a second difference signal includes means for latching said incoming signal at a level change of said reference signal.

7. The digital discriminator according to claim 1, wherein said means for generating a direction signal includes means for latching one of said difference signals at a level change of said other difference signal.

8. The digital discriminator according to claim 1, wherein said means for recovering modulation includes a capacitor and means for generating current pulses to said capacitor.

9. A digital discriminator comprising:
means for receiving an incoming signal;
means for generating a first reference signal having a first phase signal and a second phase signal;
means for generating a first difference signal corresponding to the frequency difference between said first phase signal and said incoming signal;
means for generating a second difference signal corresponding to the frequency difference between said second phase signal and said incoming signal;
means for generating a direction signal from said first and second difference signals to indicate if the incoming signal frequency is greater than or less than the reference signal frequency;
means for generating a second reference signal;
means for generating pulses from said second reference signal and a selected one of said difference signals;
means for recovering modulation from said generated pulses and said direction signal.

10. The digital discriminator according to claim 9, including said first phase signal being about 90 degrees out of phase with said second phase signal.

11. The digital discriminator according to claim 9, wherein said means for generating a first difference signal includes means for latching said incoming signal at a level change of said first phase signal.

12. The digital discriminator according to claim 9, wherein said means for generating a second difference signal includes means for latching said incoming signal at a level change of said second phase signal.

13. The digital discriminator according to claim 9, wherein said means for generating a direction signal includes means for latching one of said difference signals at a level change of said other difference signal.

14. The digital discriminator according to claim 9, wherein said means for recovering modulation from said incoming signal includes capacitive means and means for generating current pulses to said capacitive means.

15. The digital discriminator according to claim 9 wherein said means for generating pulses includes means for latching one of said difference signals at a level change of said second reference signal.

16. The digital discriminator according to claim 9 wherein said pulse signal has a predetermined maximum pulse width which is dependent upon the frequency of said second reference signal.

17. A digital discriminator comprising:
means for receiving an incoming signal;
means for generating a reference signal having a first phase signal and a second phase signal;
means for generating a first difference signal corresponding to the frequency difference between said first phase signal and said incoming signal;
means for generating a second difference signal corresponding to the frequency difference between said second phase signal and said incoming signal;
means for generating a direction signal from said first and second difference signals to indicate if the incoming signal frequency is greater than or less than the reference signal frequency;
means for low pass filtering said second difference signal, thereby generating a filtered second difference signal;
means for generating pulses relating to the difference in frequency between the reference signal and the incoming signal from said filtered difference signal; and
means for recovering modulation from said generated pulses and said direction signal.

18. The digital discriminator according to claim 17, including said first phase signal being about 90 degrees out of phase with said second phase signal.

19. The digital discriminator according to claim 17, wherein said means for generating a first difference signal includes means for latching said incoming signal at a level change of said first phase signal.

20. The digital discriminator according to claim 17, wherein said means for generating a second difference signal includes means for latching said incoming signal at a level change of said second phase signal.

21. The digital discriminator according to claim 17, wherein said means for generating a direction signal includes means for latching one of said difference signals at a level change of said other difference signal.

22. The digital discriminator according to claim 17, wherein said means for recovering modulation from said incoming signal includes capacitive means and means for generating current pulses to said capactive means.

23. The digital discriminator according to claim 17, wherein said means for generating pulses includes means for latching said filtered difference signal at a level change of said reference signal.

24. The digital discriminator according to claim 17 wherein said pulse signal has a predetermined maximum pulse width which is dependent upon the frequency of said reference signal.

25. The digital discriminator according to claim 17 wherein said pulse signal occurs once at each transition of one of said difference signals.

26. A method of digital discrimination, comprising:

receiving an incoming signal;
generating a reference signal;
generating a first and second difference signal, each corresponding to the frequency difference between said reference signal and said incoming signal, but having offset phases;
generating a direction signal from said first and second difference signals, said direction signal indicating if the incoming signal frequency is greater than or less than the reference signal frequency;
generating pulses relating to the difference in frequency between the reference signal and the incoming signal; and
recovering modulation from said generated pulses and said direction signal.

* * * * *